US 6,338,988 B1
Jan. 15, 2002

(54) METHOD FOR FABRICATING SELF-ALIGNED THIN-FILM TRANSISTORS TO DEFINE A DRAIN AND SOURCE IN A SINGLE PHOTOLITHOGRAPHIC STEP

(75) Inventors: Paul S. Andry, Mohegan Lake; Frank R. Libsch, White Plains, both of NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/410,280

(22) Filed: Sep. 30, 1999

(51) Int. Cl.[7] .......................... H01L 21/00; H01L 21/84
(52) U.S. Cl. ...................... 438/158; 438/149; 438/151; 438/160
(58) Field of Search ................................ 438/149, 151, 438/158–160

(56) References Cited

U.S. PATENT DOCUMENTS

| | | | | |
|---|---|---|---|---|
| 5,010,027 A | | 4/1991 | Possin et al. | 438/159 |
| 5,241,192 A | * | 8/1993 | Possin et al. | 257/59 |
| 5,580,796 A | * | 12/1996 | Takizawa et al. | 438/158 |
| 5,874,326 A | | 2/1999 | Lyu | 438/158 |
| 5,953,595 A | * | 9/1999 | Gosain et al. | 438/158 |
| 6,022,753 A | * | 2/2000 | Park et al. | 438/30 |

* cited by examiner

*Primary Examiner*—Carl Whitehead, Jr.
*Assistant Examiner*—Jamie L. Brophy
(74) *Attorney, Agent, or Firm*—F. Chau & Associates, LLP

(57) ABSTRACT

A method for forming a thin film transistor having source and drain electrodes self-aligned to a gate electrode by employing a single lithographic step includes forming an opaque gate electrode on a substrate, depositing a first dielectric layer on the gate electrode and the substrate, depositing a semiconductor layer on the first dielectric layer, and depositing a second dielectric layer on the semiconductor layer. A first photoresist is deposited on the second dielectric layer and patterned by employing the gate electrode as a mask for blocking light used to expose the first photoresist. The second dielectric layer is etched to form a top insulator portion of the second dielectric layer in alignment with the gate electrode. The first photoresist is removed. A doped semiconductor layer and a conductive layer are deposited. A second photoresist is formed on the conductive layer. The second photoresist is patterned to form components patterns and to form a contiguous transistor electrode pattern covering the top insulator portion. Non-selectively etching the second photoresist and the conductive layer, a gap is formed in the second photoresist for the transistor electrode pattern at the top insulator portion. The conductive layer and the doped semiconductor layer are etched selective to the second photoresist such that a source electrode and a drain electrode are formed which are self-aligned relative to the gate electrode.

20 Claims, 4 Drawing Sheets

METHOD FOR FABRICATING SELF-ALIGNED THIN-FILM TRANSISTORS TO DEFINE A DRAIN AND SOURCE IN A SINGLE PHOTOLITHOGRAPHIC STEP

BACKGROUND OF THE INVENTION

1. Field of the Invention

The present invention relates to thin-film field-effect transistors, and more particularly to a method of fabricating devices which aligns source/drain (S/D) contacts with a gate electrode, and utilizes a single lithographic step to minimize the time and cost of producing such a self-aligned device.

2. Description of the Related Art

In a conventional staggered inverted bottom-gate thin-film transistor (TFT), such as those used in active matrix displays, the source and drain electrodes of all TFTs are aligned globally using corner alignment marks on a surface. The use of alignment marks leads to offsets in positions underlying gate electrodes and source and drain contacts electrodes. Because the S/D contacts are not self-aligned, the degree of overlap is usually increased at the mask level to allow for these offsets. This is undesirable because it increases the source-drain to gate (S/D–G) capacitance of the devices, which in turn increases the pixel feedthrough voltage ($\Delta Vp$) in the active matrix display.

The feedthrough voltage is caused by charge stored in the TFT S-G capacitance (Cgs) when the pixel TFT has charged the pixel and returns to its OFF state. The $\Delta Vp$ offset must be compensated for using a combination of passive elements (storage capacitors) included in the active matrix design and suitable electronic drive schemes. Any shift in S/D alignment across the active matrix may lead to incomplete compensation of $\Delta Vp$, and hence to visual artifacts in the finished display.

Therefore, a need exists to produce TFTs with self-aligned S/D contacts to reduce or eliminate the problems outlined above. In addition to reducing S/D–G capacitance and increasing pixel charging uniformity, it is also desirable to produce a TFT with a shorter channel since less total S/D overlap is should be reduced. A shorter channel results in more current drive available for pixel charging and hence a shorter charging time which is important for high-resolution, high-performance active matrix displays.

SUMMARY OF THE INVENTION

A method, in accordance with the invention, for forming a thin film transistor having source and drain electrodes self-aligned to a gate electrode by employing a single lithographic step includes forming an opaque gate electrode on a substrate, depositing a first dielectric layer on the gate electrode and the substrate, depositing a semiconductor layer on the first dielectric layer, and depositing a second dielectric layer on the semiconductor layer. A first photoresist is deposited on the second dielectric layer and patterned by employing the gate electrode as a mask for blocking light used to expose the first photoresist. The second dielectric layer is etched to form a top insulator portion of the second dielectric layer in alignment with the gate electrode. The first photoresist is removed. A doped semiconductor layer and a conductive layer are deposited. A second photoresist is formed on the conductive layer. The second photoresist is patterned to form component patterns and to form a contiguous transistor electrode pattern covering the top insulator portion. Non-selectively etching the second photoresist and the conductive layer, a gap is formed in the second photoresist for the transistor electrode pattern at the top insulator portion. The conductive layer and the doped semiconductor layer are etched selective to the second photoresist such that a source electrode and a drain electrode are formed which are self-aligned relative to the gate electrode.

Another method, in accordance with the invention, for forming a thin film transistor for an active matrix liquid crystal display having source and drain electrodes self-aligned to a gate electrode by employing a single lithographic step includes forming an opaque gate conductor layer on a substrate. The gate conductor layer has gate electrodes. A first dielectric layer is deposited on the gate conductor layer, on the gate electrodes and on the substrate, and a semiconductor layer is deposited on the first dielectric layer. A second dielectric layer is deposited on the semiconductor layer, and a first photoresist is deposited on the second dielectric layer. The first photoresist is patterned by employing the gate electrodes as a mask for blocking light used to expose the first photoresist. The second dielectric layer is etched to form a top insulator portion of the second dielectric layer in alignment with each of the gate electrodes. The first photoresist is then removed. A doped semiconductor layer is deposited on the top insulator and the semiconductor layer, and a conductive layer is deposited on the doped semiconductor layer. A second photoresist is formed on the conductive layer, and the second photoresist forms a non-planar surface due to a height of the top insulator portion. The second photoresist is patterned for pixel components and forms a contiguous transistor electrode pattern covering the top insulator portion. The second photoresist and the conductive layer are non-selectively etched to form a gap in the second photoresist for the transistor electrode pattern at the top insulator portion. The second photoresist is removed from the top insulator portion such that a sufficient thickness of the second photoresist pattern remains to provide for etching of the conductive and doped semiconductor layers. The conductive layer and the doped semiconductor layer are etched selective to the second photoresist such that a source electrode and a drain electrode are formed which are self-aligned relative to the gate electrode. The second photoresist is removed.

In other methods, the step of non-selectively etching the second photoresist may include the step of plasma ashing the second photoresist and the conductive layer to form the gap in the second photoresist at the top insulator portion. The step of plasma ashing the second photoresist may include employing oxygen plasma. The conductive layer may include at least one of aluminum, molybdenum, chromium, tungsten and copper, and the step of etching the conductive layer may include the step of wet etching the conductive layer and the doped semiconductor layer with a mixture of phosphoric, acetic and nitric acids. The conductive layer may include at least one of Indium Tin Oxide and Indium Zinc Oxide. The step of patterning the second photoresist layer to form patterns for pixel components may include the step of patterning the second photoresist layer to form patterns for at least one of data lines and capacitor electrodes. The steps of forming the top insulator portion with tapered edges and forming the gate electrode with tapered edges may be included. The thin film transistor may include a length between about 2 microns to about 10 microns.

These and other objects, features and advantages of the present invention will become apparent from the following detailed description of illustrative embodiments thereof, which is to be read in connection with the accompanying drawings.

BRIEF DESCRIPTION OF DRAWINGS

The invention will be described in detail in the following description of preferred embodiments with reference to the following figures wherein.

DETAILED DESCRIPTION OF PREFERRED EMBODIMENTS

The present invention includes a structure and fabrication process for thin film transistors having sources and drains self-aligned to a gate electrode. By providing self-alignment of S/D contacts and the gate electrode significant space savings are achieved (e.g., an order of magnitude is saved in length), shorter channel lengths are provided along with electrical characteristics as will be described. Advantageously, the self-aligned transistor can be provided using a single lithographic step, i.e., one resist coating, one exposure, one development, and one strip.

Figure 1:
FIG. 1 is a cross-sectional view of a partially fabricated thin film transistor showing a substrate with a gate electrode formed thereon in accordance with the present invention.

Referring now to the drawings in which like numerals represent the same or similar elements and initially to FIG. 1, a cross-sectional view of a partially fabricated transistor for a pixel cell is depicted after a first masking step in which a gate electrodes 10 is defined on a substrate 12. Substrate 12 preferably includes a transparent material, such as, glass, quartz or plastic. Gate electrode 10 is formed by a metal or conductor deposition and patterned lithographically. Gate electrode 10 is preferably formed from an opaque material, and gate electrode 10 may be a single conductive layer of a metal such as chromium (Cr), tungsten (W), aluminum (Al), copper (Cu) and other electrically equivalent conductors, multilayer structure of metals in a capped or clad arrangement such as chromium above and/or below Al (Cr/Al), Molybdenum over Tungsten (Mo/W), Molybdenum above and/or below Al (Mo/Al), and other similar conductors, and alloy structures, including, for example several percent of Neodymium in Aluminum, etc. Gate electrode 10 preferably includes tapered edges to increase step overage of overlying materials.

Figure 2:
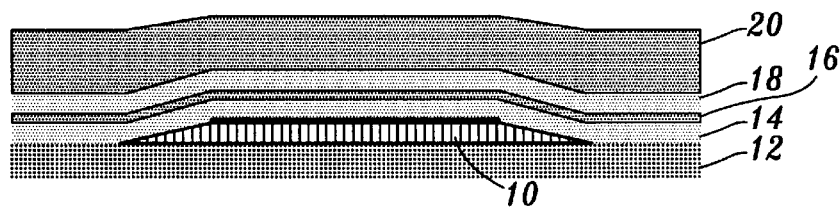
FIG. 2 is a cross-sectional view of the thin film transistor of FIG. 1 showing a first dielectric layer, a semiconductor layer, a second dielectric layer and a photoresist formed thereon in accordance with the present invention.

Referring to FIG. 2, a trilayer structure is formed which includes a dielectric layer 14, a semiconductor layer 16 and a dielectric layer 18. Dielectric layers 14 and 18 need not be the same material. Dielectric layers 14 and 18 may include, for example, silicon nitride, oxide, oxynitride, aluminum oxide, tantalum oxide, plasma deposited or reactively sputtered silicon oxide (SiOx), spin-on-glass, organic materials, such as, polyamide or BCB, or high-k dielectrics, such as, Barium Strontium Titanium oxide (BST), Barium Zirconium Titanium oxide (BZT), and tantalum pentoxide or combination thereof. Dielectric layers 14 and 18 may each include multi-layers, for example, $SiN_x$, $SiN_x/SiO_y$, $SiN_x/SiO_y/SiN_x$. These layers may be prepared by anodization and/or by plasma enhanced chemical vapor deposition (PECVD), electron cyclotron resonance CVD, laser-assisted CVD, or sputtering. Semiconductor layer 16 may include amorphous silicon (a-Si or a-Si:H), polysilicon or other layer of semi-conductor material for forming a current channel for the transistor. A layer of photoresist 20 is formed on dielectric layer 18. Photoresist 20 may included photo-patternable polyimides, or self-assembled monolayers (also known as SAMs).

Figure 3:
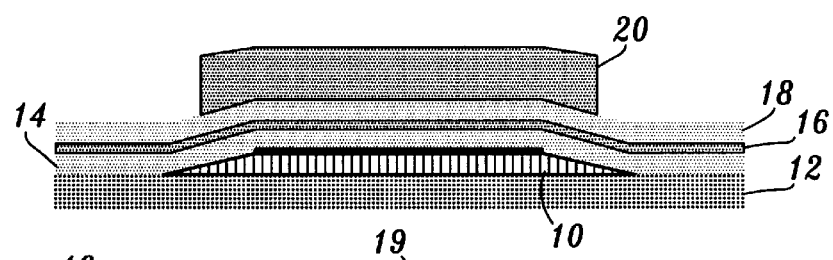
FIG. 3 is a cross-sectional view of the thin film transistor of FIG. 2 showing the photoresist patterned by employing the gate electrode as a mask in accordance with the present invention.

Referring to FIG. 3, photoresist 20 is exposed using backside exposure (in the direction of arrow "A") to ultra-violet light using gate electrode 10 as a mask. Subsequent development of photoresist 20 is performed to achieve the structure of FIG. 3. The length of the photoresist segment can be controlled by the exposure time of the resist to UV light. The remaining photoresist is advantageously centered over gate electrode 10.

Figure 4A:
FIG. 4A is a cross-sectional view of the thin film transistor of FIG. 3 showing the second dielectric layer etched to form a top insulation portion (Istop) in accordance with the present invention.
Figure 4B:
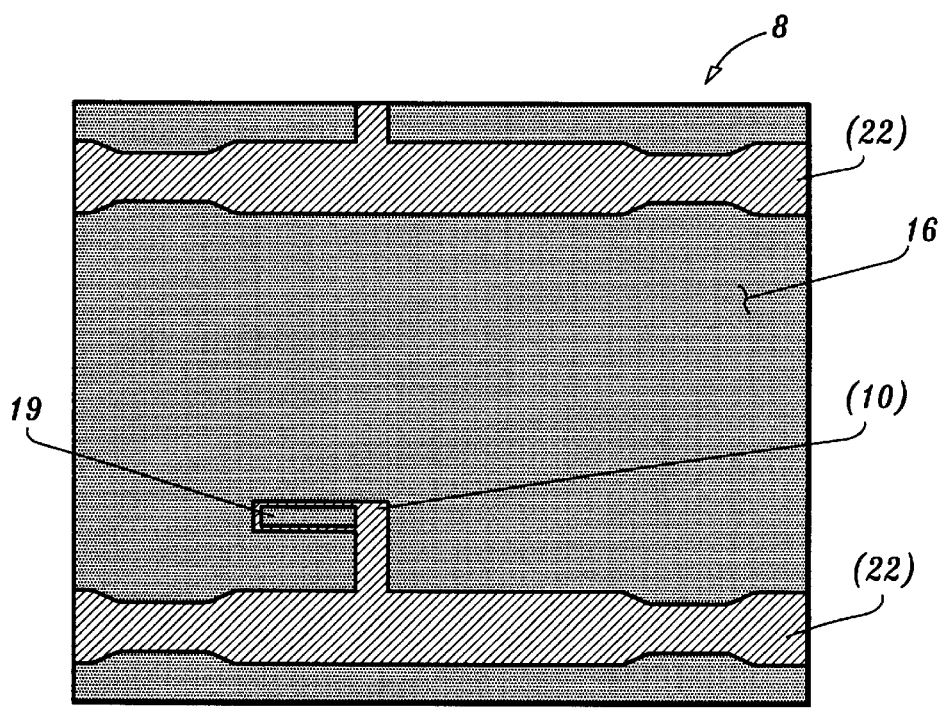
FIG. 4B is a top plan view of a pixel electrode (with gate lines visible for clarity) showing the second dielectric layer etched to form a top insulation portion (Istop) in accordance with the present invention.

Referring to FIGS. 4A and 4B, etching of dielectric layer 18 is performed to leave a portion 19 of dielectric layer 18 centered over gate electrode 10. Portion 19 may be referred to as an Istop or a top insulator. Portion 19 preferably includes tapered edges. FIG. 4B shows a top view of a pixel cell 8 after portion 19 has been etched. Gate lines 22 are shown while semiconductor layer 16 and dielectric layer 14 are invisible for clarity. In the layout views of FIGS. 4B, 5B, 6B, 7B and 8B, reference numerals in parentheses indicate that the component is obscured by another layer or layers formed thereon.

Figure 5A:
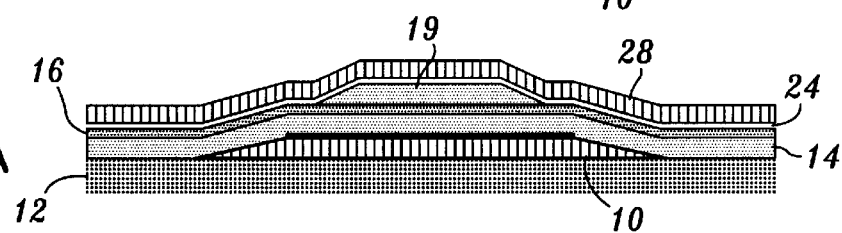
FIG. 5A is a cross-sectional view of the thin film transistor of FIG. 4A showing a doped semiconductor layer and a conductor layer deposited in accordance with the present invention.
Figure 5B:
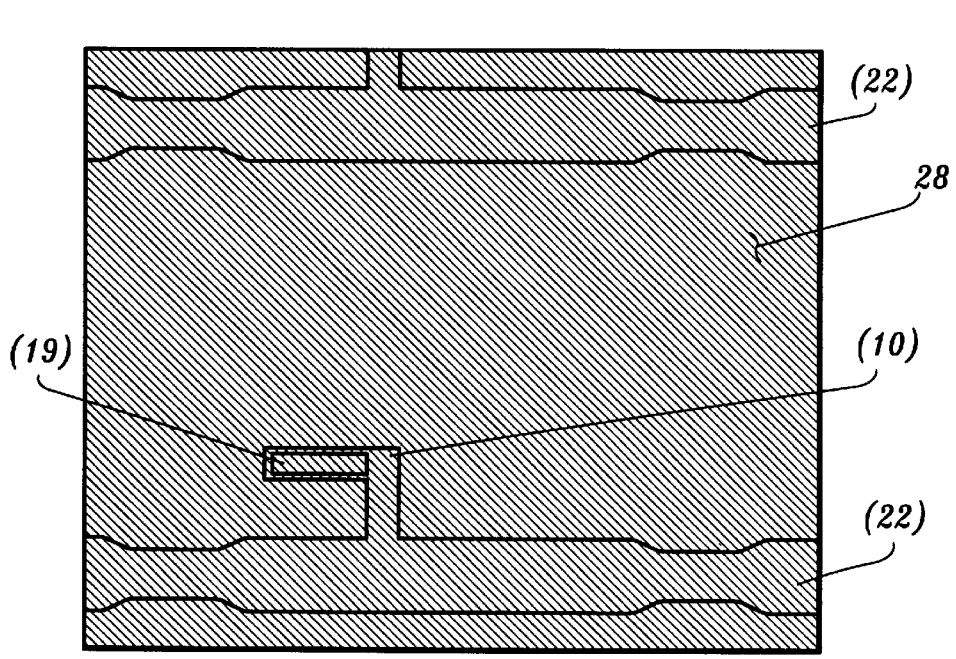
FIG. 5B is a top plan view of the pixel electrode (with gate lines visible for clarity) of FIG. 4B showing a doped semiconductor layer and a conductor layer deposited in accordance with the present invention.

Referring to FIGS. 5A and 5B, a doped semiconductor layer 24 is deposited. Semiconductor layer 24 may include heavily doped amorphous silicon, microcrystalline or polycrystalline silicon. Layer 24 is preferably n+ doped however, p-doping may also be performed. Layer 24 may be plasma deposited by employing a plasma enhanced chemical vapor deposition (PECVD) process. Layer 24 contacts layer 16 along sides of portion 19. A conductive layer 28, for example, a transparent conductor layer, is deposited on doped semiconductor layer 24. Conductor layer 28 may include Indium Tin Oxide (ITO) or Indium Zinc Oxide (IZO), aluminum, aluminum alloys, clad aluminum, molybdenum, chromium, moly-tungsten, copper. Conductor 28 may be sputtered on doped layer 24.

Figure 6A:
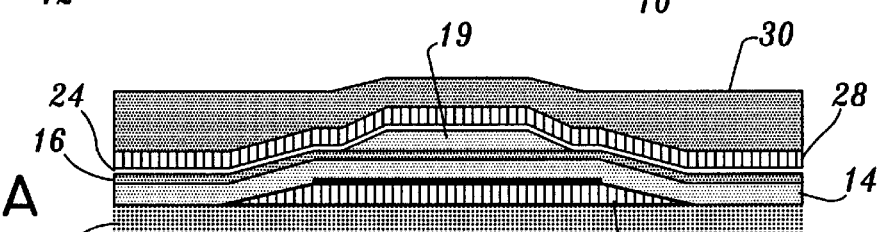
FIG. 6A is a cross-sectional view of the thin film transistor of FIG. 5A showing a second photoresist deposited in accordance with the present invention.
Figure 6B:
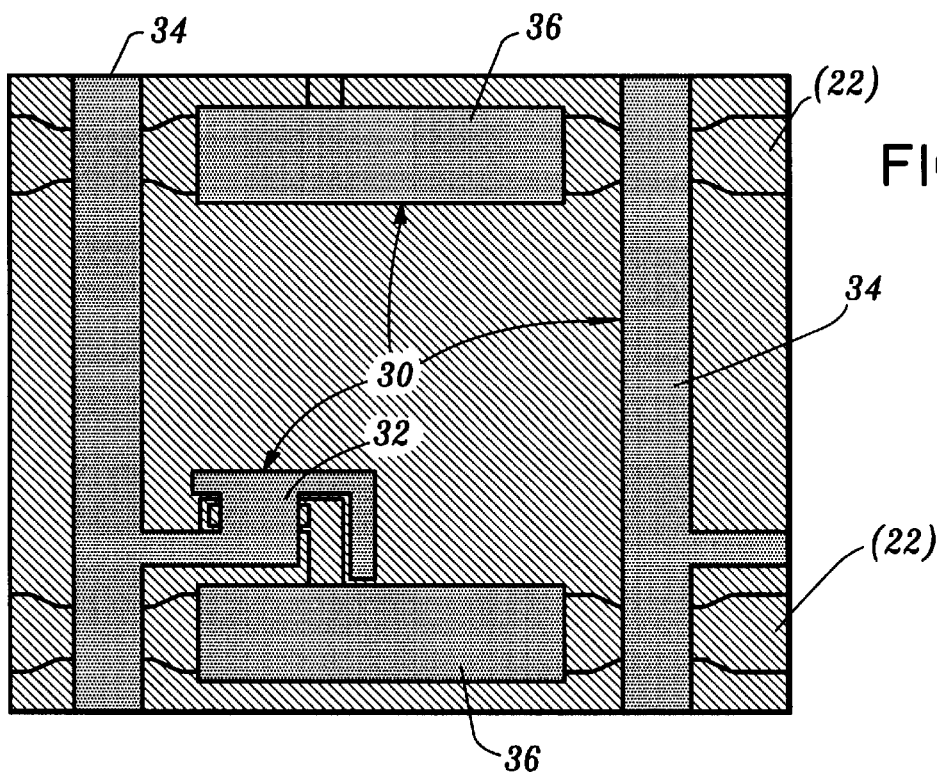
FIG. 6B is a top plan view of the pixel electrode (with gate lines visible for clarity) of FIG. 5B showing a second photoresist deposited and patterned without a gap in the pattern for S/D electrodes in accordance with the present invention.

Referring to FIGS. 6A and 6B, a layer of photoresist 30 is deposited which may include photo-patternable polyimides, or self-assembled monolayers. Photoresist 30 is patterned by UV exposure through a top mask followed by development to leave resist images or patterns of a source/drain 32(without a gap therebetween), single lines 34 (for data lines), capacitor electrode patterns 36 and all other devices which may be part of an active matrix display as shown in FIG. 6B.

Figure 7A:
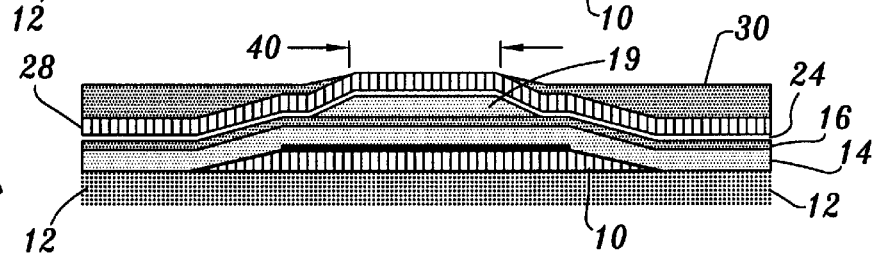
FIG. 7A is a cross-sectional view of the thin film transistor of FIG. 6A showing the second photoresist thinned to expose the top insulator portion in accordance with the present invention.
Figure 7B:
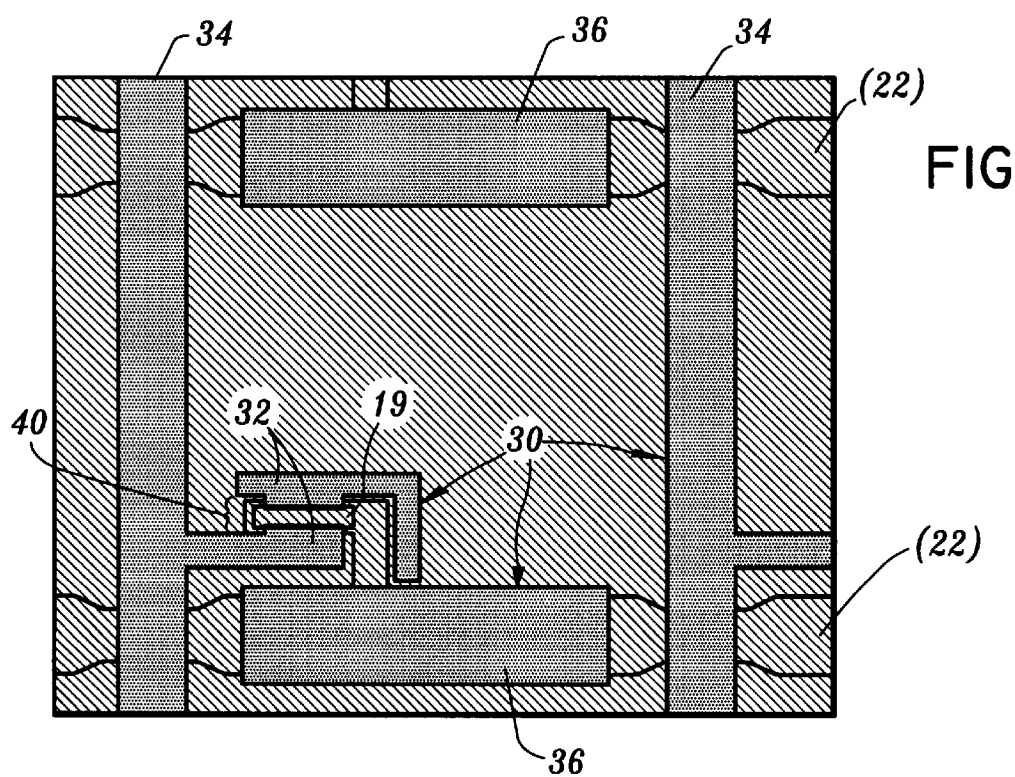
FIG. 7B is a top plan view of the pixel electrode (with gate lines visible for clarity) of FIG. 6B showing the second photoresist thinned to expose the top insulator portion and form a gap in the resist for the S/D electrodes in accordance with the present invention.

Referring to FIGS. 7A and 7B, the patterned resist images are etched such that the resist overlying portion 19 is completely removed before the resist elsewhere has been removed. This non-selective etch or plasma ashing thins all patterned portions, e.g., source/drain pattern 32, data line patterns 34, capacitor electrode patterns 36, etc. Since photoresist over portion 19 (Istop) is thinner a breakthrough is achieved in a shorter time in this region, thereby forming a gap 40 in photoresist 30 (see FIG. 7B). In a preferred embodiment, pure oxygen is employed for the non-selective etch as there is minimal attack or damage to other metal, semiconducting and insulating materials. Other embodiments may include oxygen mixed in proportion with an inert gas such as Ar or He, or the use of another oxygen-containing gas such as nitrous oxide ($N_2O$).

Figure 8A:
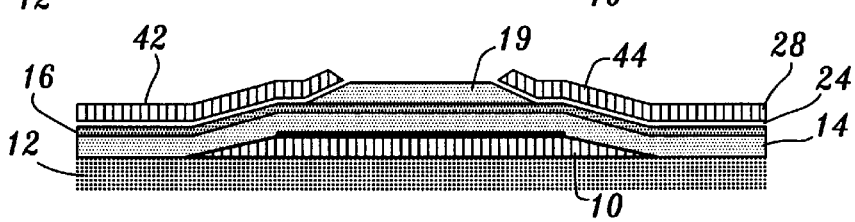
FIG. 8A is a cross-sectional view of the thin film transistor of FIG. 7A showing the second photoresist removed after being employed to etch the conductor and the doped semiconductor layers in accordance with the present invention.
Figure 8B:
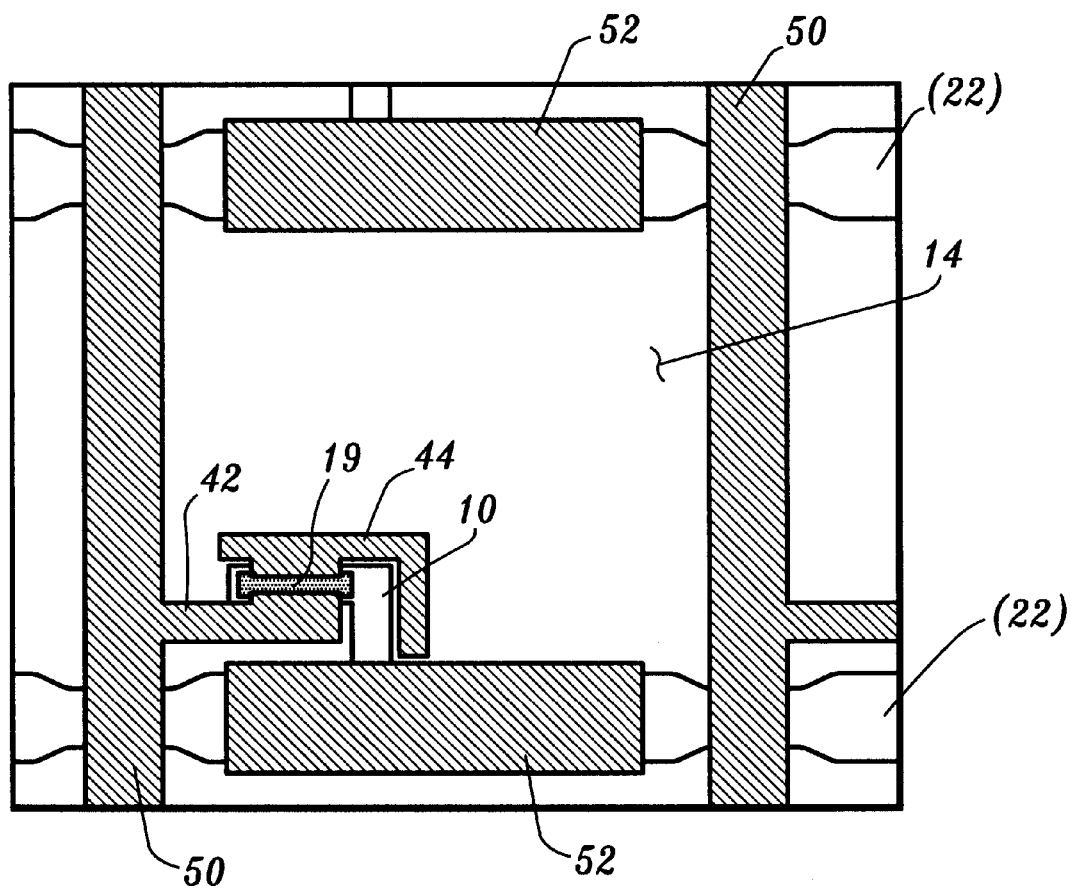
FIG. 8B is a top plan view of the pixel electrode (with gate lines visible for clarity) of FIG. 7B showing the second photoresist removed after being employed to etch the conductor and the doped semiconductor layers in a pattern in accordance with the present invention.

Referring to FIGS. 8A and 8B, conductor layer 28 and doped semiconductor layer 24 are etched in accordance with the resist pattern such that a drain electrode 42 and a source electrode 44 are formed and are aligned to gate electrode 10. Signal lines (data lines) 50, capacitor electrodes 52 and all other devices are simultaneously formed. In preferred embodiments, the etching of layers 24 and 28 is performed by a wet etching process. In one embodiment, the etching uses a mixture of phosphoric, acetic and nitric acids known as a PAN etch for aluminum, Al alloys and molybdenum metals. Processing now continues as is known in the art.

In U.S. Pat. No. 5,010,027 to Possin et al., a process is described wherein a self-aligned TFT is formed. Possin et al. employ a planarization layer, which may be photoresist, but it is clear from their description that the patterning of the actual TFT contacts takes place in a subsequent step. In other words, they employ two distinct coating steps to achieve self-alignment: 1) a planarization coating step followed by non-selective etch and strip, then 2) an actual S/D patterning step requiring another resist coating.

Advantageously, the present invention patterns the S/D contacts and other conductive components and self-aligns the S/D contacts in a single step by plasma ashing the array data level lithograph. This difference is significant since it achieves one less coating and stripping cycle which is costly in materials, throughput and ultimately in active matrix panel cost. The savings of process steps and time is an important aspect of achieving lost cost and easily manufacturable active matrix displays. The present invention advantageously forms a self-aligned transistor by employing photoresist patterning (e.g. coating, exposure, development and hard bake) to define the S/D contacts and other components, and the patterned resist is non-selectively etched, e.g., by plasma ashing, the resist lying above the top insulator (Istop) until the resist has been completely removed over the Istop, but before the resist pattern has been completely removed elsewhere such that standard selective conductive and doped semiconductor selective etches may directly follow.

In accordance with the invention, a region of the gate conductor (gate lines) which forms gate electrode 10 (FIG. 1) of the pixel TFT is chosen according to the final design length of the TFT. In a conventional non-self-aligned process, the minimum width is in the neighborhood of about 11 $\mu$m to allow for sufficient overlap of the D/S electrodes over the Istop feature. The minimum width of the Istop feature depends on the development and etch bias of the back-expose process. In the non-self-aligned process of the prior art, it also depends on the minimally acceptable gap size of the photoexposure process, which is in the neighborhood of between about 2 $\mu$m and about 3 $\mu$m.

Considering overlay accuracy, a typical design for the conventional non-self-aligned TFT is: gate width=11 $\mu$m, Istop width=8 $\mu$m, a gap between S/D on top of Istop=4 $\mu$m. This means the S/D contact area (the area between the edge of the underlying gate and the base edge of the Istop) is about 1.5 $\mu$m on both sides.

If it were chosen to have the same contact area, but use the self-aligned process as described for the present invention, the minimum gap size between S/D contacts is no longer a concern. Dropping this constraint alone permits a gate width of about 7 $\mu$m and an Istop width of about 4 $\mu$m. Since the overlay of the gap on the Istop is not a concern the TFT can be reduced in size. For example, the TFTs may be as short as about 2 $\mu$ms! In accordance with the invention the thin film transistor may include a length between about 2 microns to about 10 microns.

Referring to FIG. 8, gate metal 10 thickness may be between about 0.3 and about 0.5 $\mu$m. Gate insulator 14 thickness may be between about 0.3 and about 0.4 $\mu$m. Semiconductor layer 16 and doped semiconductor layer 24 may each have a thickness of between about 400 to about 1000 Å. Istop (portion 19) includes a thickness of between about 0.3 and about 0.7 $\mu$m (for the self-aligned device of the present invention, a thicker layer is advantageous for obtaining thinner resist on the Istop top, thus a better window for exposing the sacrificial metal using the plasma ash is achieved). Conductor 28 (if ITO or IZO is used includes a thickness of about 500 Å.

Tapering of the gate metal, Istop layer and any vias through the semiconducting or insulating layers is advantageous to provide a good yield in the finished array. Taper angles for the sides of the gate and data buslines may range from about 15 to about 45 degrees. Tapering of the Istop insulator may range from about 20 to about 60 degrees. For self-aligned devices, the inventors have found that the taper should not be too shallow with the preferred angle being between about 30 and about 45 degrees. Likewise, the edges of vias through the gate insulator are commonly in the range from 20 to 60 degrees.

Having described preferred embodiments of a method for fabricating self-aligned thin-film transistors to define a drain and source in a single photolithographic step (which are intended to be illustrative and not limiting), it is noted that modifications and variations can be made by persons skilled in the art in light of the above teachings. It is therefore to be understood that changes may be made in the particular embodiments of the invention disclosed which are within the scope and spirit of the invention as outlined by the appended claims. Having thus described the invention with the details and particularity required by the patent laws, what is claimed and desired protected by Letters Patent is set forth in the appended claims.

What is claimed is:

1. A method for forming a thin film transistor having source and drain electrodes self-aligned to a gate electrode by employing a single lithographic step, comprising the steps of:

forming an opaque gate electrode on a substrate;

depositing a first dielectric layer on the gate electrode and the substrate;

depositing a semiconductor layer on the first dielectric layer;

depositing a second dielectric layer on the semiconductor layer;

depositing a first photoresist on the second dielectric layer and patterning the first photoresist by employing the gate electrode as a mask for blocking light used to expose the first photoresist;

etching the second dielectric layer to form a top insulator portion of the second dielectric layer in alignment with the gate electrode;

removing the first photoresist;

depositing a doped semiconductor layer;

depositing a conductive layer on the doped semiconductor layer;

forming a second photoresist on the conductive layer;

patterning the second photoresist to form patterns for components and to form a contiguous transistor electrode pattern covering the top insulator portion;

non-selectively etching the second photoresist and the conductive layer to form a gap in the second photoresist for the transistor electrode pattern at the top insulator portion; and etching the conductive layer and the doped semiconductor layer selective to the second photoresist such that a source electrode and a drain electrode are formed which are self-aligned relative to the gate electrode.

2. The method as recited in claim 1, wherein the step of non-selectively etching the second photoresist includes the step of plasma ashing the second photoresist and the conductive layer to form the gap in the second photoresist at the top insulator portion.

3. The method as recited in claim 2, wherein the step of plasma ashing the second photoresist includes employing oxygen plasma.

4. The method as recited in claim 1, wherein the conductive layer includes at least one of aluminum, molybdenum, chromium, tungsten and copper.

5. The method as recited in claim 4, wherein the step of etching the conductive layer includes the step of wet etching the conductive layer and the doped semiconductor layer with a mixture of phosphoric, acetic and nitric acids.

6. The method as recited in claim 1, wherein the conductive layer includes at least one of Indium Tin Oxide and Indium Zinc Oxide.

7. The method as recited in claim 1, wherein the step of patterning the second photoresist layer to form patterns for components includes the step of patterning the second photoresist layer to form patterns for at least one of data lines and capacitor electrodes.

8. The method as recited in claim 1, further comprising the step of forming the top insulator portion with tapered edges.

9. The method as recited in claim 1, further comprising the step of forming the gate electrode with tapered edges.

10. The method as recited in claim 1, wherein the step of non-selectively etching includes the step of forming the thin film transistor with a length of between about 2 microns to about 10 microns.

11. A method for forming a thin film transistor for an active matrix liquid crystal display having source and drain electrodes self-aligned to a gate electrode by employing a single lithographic step, comprising the steps of:

forming an opaque gate conductor layer on a substrate, the gate conductor layer having gate electrodes;

depositing a first dielectric layer on the gate conductor layer, on the gate electrodes and on the substrate;

depositing a semiconductor layer on the first dielectric layer;

depositing a second dielectric layer on the semiconductor layer;

depositing a first photoresist on the second dielectric layer and patterning the first photoresist by employing the gate electrodes as a mask for blocking light used to expose the first photoresist;

etching the second dielectric layer to form a top insulator portion of the second dielectric layer in alignment with each of the gate electrodes;

removing the first photoresist;

depositing a doped semiconductor layer on the top insulator and the semiconductor layer;

depositing a conductive layer on the doped semiconductor layer;

forming a second photoresist on the conductive layer, the second photoresist forming a non-planar surface due to a height of the top insulator portion;

patterning the second photoresist to form patterns for pixel components and to form a contiguous transistor electrode pattern covering the top insulator portion;

non-selectively etching the second photoresist and the conductive layer to form a gap in the second photoresist for the transistor electrode pattern at the top insulator portion, the second photoresist being removed from the top insulator portion such that a sufficient thickness of the second photoresist pattern remains to provide for etching of the conductive and doped semiconductor layers;

etching the conductive layer and the doped semiconductor layer selective to the second photoresist such that a source electrode and a drain electrode are formed which are self-aligned relative to the gate electrode; and removing the second photoresist.

12. The method as recited in claim 11, wherein the step of non-selectively etching the second photoresist includes the step of plasma ashing the second photoresist and the conductive layer to form the gap in the second photoresist at the top insulator portion.

13. The method as recited in claim 12, wherein the step of plasma ashing the second photoresist includes employing oxygen plasma.

14. The method as recited in claim 11, wherein the conductive layer includes at least one of aluminum, molybdenum, chromium, tungsten and copper.

15. The method as recited in claim 14, wherein the step of etching the conductive layer includes the step of wet etching the conductive layer and the doped semiconductor layer with a mixture of phosphoric, acetic and nitric acids.

16. The method as recited in claim 11, wherein the conductive layer includes at least one of Indium Tin Oxide and Indium Zinc Oxide.

17. The method as recited in claim 11, wherein the step of patterning the second photoresist layer to form patterns for pixel components includes the step of patterning the second photoresist layer to form patterns for at least one of data lines and capacitor electrodes.

18. The method as recited in claim 11, further comprising the step of forming the top insulator portion with tapered edges.

19. The method as recited in claim 11, further comprising the step of forming the gate electrode with tapered edges.

20. The method as recited in claim 11, wherein the step of non-selectively etching includes the step of forming the thin film transistor with a length of between about 2 microns to about 10 microns.

* * * * *